US012644186B2

(12) United States Patent
Yamaguchi et al.

(10) Patent No.: US 12,644,186 B2
(45) Date of Patent: Jun. 2, 2026

(54) SUBSTRATE PROCESSING APPARATUS AND SUBSTRATE PROCESSING METHOD

(71) Applicant: Tokyo Electron Limited, Tokyo (JP)

(72) Inventors: Tatsuya Yamaguchi, Tokyo (JP); Yutaka Sasaki, Iwate (JP); Makoto Takahashi, Iwate (JP); Toru Ishii, Iwate (JP); Naoshige Fushimi, Yamanashi (JP); Koji Yoshii, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 410 days.

(21) Appl. No.: 18/210,409

(22) Filed: Jun. 15, 2023

(65) Prior Publication Data

US 2023/0416920 A1      Dec. 28, 2023

(30) Foreign Application Priority Data

Jun. 24, 2022      (JP) ................................. 2022-102078

(51) Int. Cl.
*C23C 16/46*          (2006.01)
*C23C 16/34*          (2006.01)
(Continued)

(52) U.S. Cl.
CPC .......... *C23C 16/466* (2013.01); *C23C 16/345* (2013.01); *C23C 16/45544* (2013.01);
(Continued)

(58) Field of Classification Search
CPC ........... H01L 21/0228; H01L 21/02164; H01L 21/02211; H01L 21/02274; H01L 21/67303; H01L 21/67109; H01L 21/67115; H01L 21/0271; H01L 21/67069; C23C 16/45527; C23C 16/45534; C23C 16/45542; C23C 16/45546; C23C 16/46; C23C 16/481; C23C 16/45578; C23C 16/466; C23C 16/345; C23C 16/45544;
(Continued)

(56) References Cited

U.S. PATENT DOCUMENTS 7,981,752 B2 *      7/2011      Lee ........................ H01L 21/324
                                                        438/308
2002/0121242 A1 *      9/2002      Minami ............ H01L 21/67109
                                                        118/724
(Continued)

FOREIGN PATENT DOCUMENTS

JP          08-008204          *      1/1996
JP          2017-084894 A          5/2017
(Continued)

OTHER PUBLICATIONS

Machine Translation JP 08-008204 (Year: 1996).*

*Primary Examiner* — Rodney G Mcdonald
(74) *Attorney, Agent, or Firm* — Venjuris, P.C.

(57)          ABSTRACT

A substrate processing apparatus includes: a processing container that accommodates a substrate; a processing gas supply that supplies a processing gas into the processing container; an exhaust that exhausts an inside of the processing container; a heater that heats the processing container; and a cooling gas injector that injects a cooling gas for cooling the substrate.

18 Claims, 9 Drawing Sheets

100

(51) Int. Cl.

| | |
|---|---|
| *C23C 16/455* | (2006.01) |
| *C23C 16/458* | (2006.01) |
| *C23C 16/52* | (2006.01) |
| *C23C 16/56* | (2006.01) |
| *H01J 37/32* | (2006.01) |
| *H10P 14/60* | (2026.01) |
| *H10P 14/694* | (2026.01) |

(52) U.S. Cl.

CPC .......... *C23C 16/4584* (2013.01); *C23C 16/52* (2013.01); *C23C 16/56* (2013.01); *H01J 37/3244* (2013.01); *H01J 37/32449* (2013.01); *H01J 37/32522* (2013.01); *H10P 14/6339* (2026.01); *H10P 14/69433* (2026.01)

(58) Field of Classification Search

CPC ..... C23C 16/4584; C23C 16/52; C23C 16/56; C23C 16/045; C23C 16/4412; C23C 16/45563; C23C 16/4583; H01J 37/3244; H01J 37/32449; H01J 37/32522; H01J 2237/3321; H01J 2237/334; H10P 14/6336; H10P 14/6339; H10P 14/6682; H10P 14/69215; H10P 14/69433; H10P 72/0421; H10P 72/0434; H10P 72/0436; H10P 72/12

USPC .......................................................... 118/715

See application file for complete search history.

(56) References Cited

U.S. PATENT DOCUMENTS

| | | | | |
|---|---|---|---|---|
| 2019/0376182 A1* | 12/2019 | Neikirk | ............ | C23C 16/45544 |
| 2021/0407774 A1* | 12/2021 | Imamura | ................ | C23C 16/56 |
| 2022/0189809 A1 | 6/2022 | Curry et al. | | |

FOREIGN PATENT DOCUMENTS

| | | |
|---|---|---|
| JP | 2019-160962 A | 9/2019 |
| JP | 2021-153141 A | 9/2021 |
| WO | 2021192005 A1 | 9/2021 |

* cited by examiner

100

START

TEMPERATURE LOWERING PROCESS ⌐S100

RAW MATERIAL GAS SUPPLYING PROCESS ⌐S101

PURGING PROCESS
(TEMPERATURE RAISING PROCESS) ⌐S102

REACTION GAS SUPPLYING PROCESS ⌐S103

PURGING PROCESS
(TEMPERATURE LOWERING PROCESS) ⌐S104

HAS PREDETERMINED
CYCLE BEEN REPEATED? ⌐S105    NO

YES

END

SUBSTRATE PROCESSING APPARATUS AND SUBSTRATE PROCESSING METHOD

CROSS-REFERENCE TO RELATED APPLICATIONS

This application is based on and claims priority from Japanese Patent Application No. 2022-102078, filed on Jun. 24, 2022, with the Japan Patent Office, the disclosure of which is incorporated herein in its entirety by reference.

TECHNICAL FIELD

The present disclosure relates to a substrate processing apparatus and a substrate processing method.

BACKGROUND

Japanese Patent Laid-Open Publication No. 2021-153141 discloses a substrate processing apparatus, which forms a SiN film on substrates. The publication further discloses a film forming process that includes a first film forming step of forming a SiN film, an etching step of etching the SiN film, and a second film forming step of forming a SiN film.

SUMMARY

According to an aspect of the present disclosure, a substrate processing apparatus includes: a processing container that accommodates a substrate; a processing gas supply that supplies a processing gas into the processing container; an exhaust that exhausts an inside of the processing container; a heater that heats the processing container; and a cooling gas injector that injects a cooling gas for cooling the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
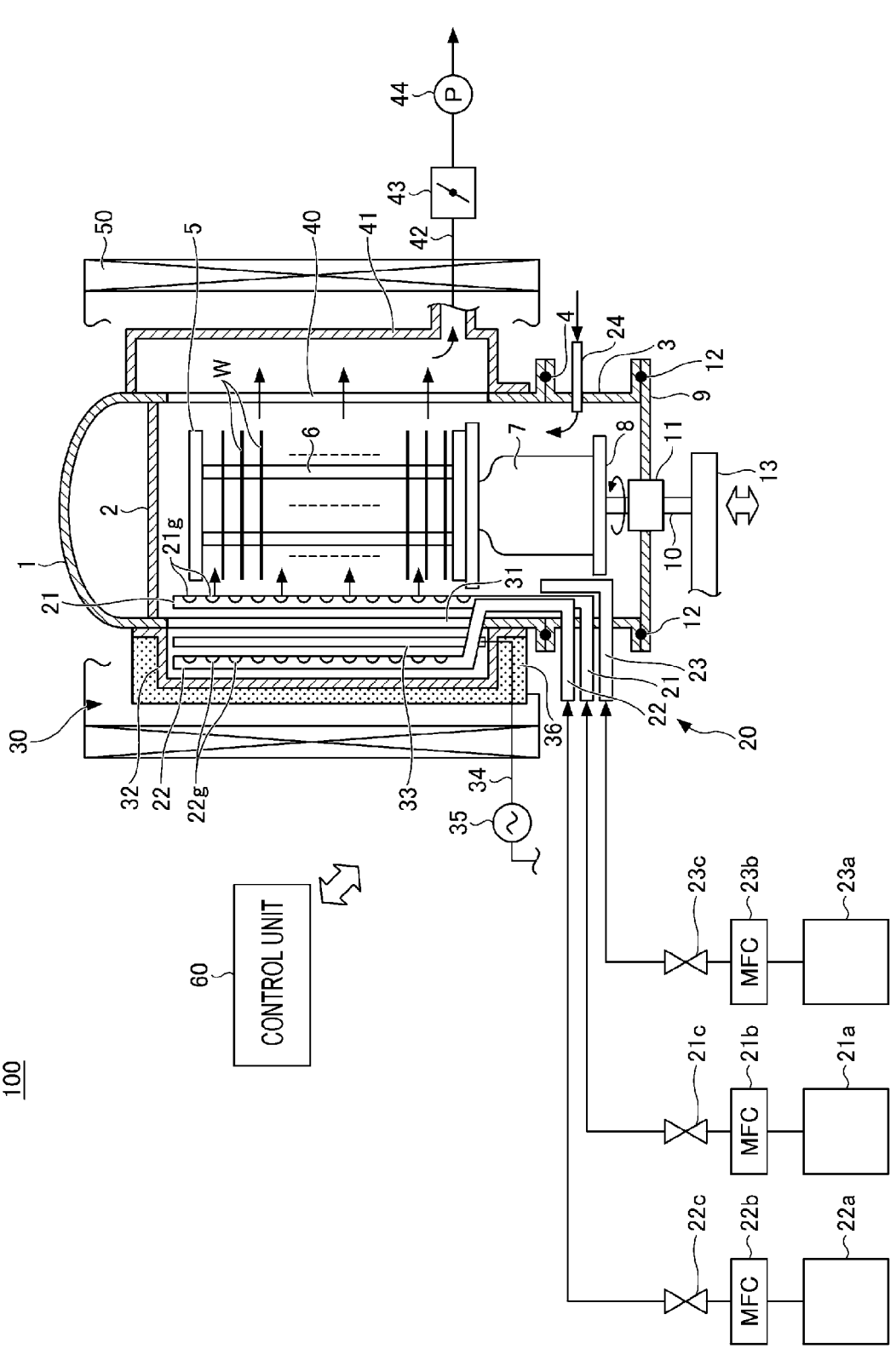
FIG. 1 is a schematic view illustrating an example of a configuration of a substrate processing apparatus.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments for implementing the present disclosure will be described with reference to the drawings. In the respective drawings, the same components will be denoted by the same reference numerals, and overlapping descriptions thereof may be omitted.

[Substrate Processing Apparatus]

Figure 2:
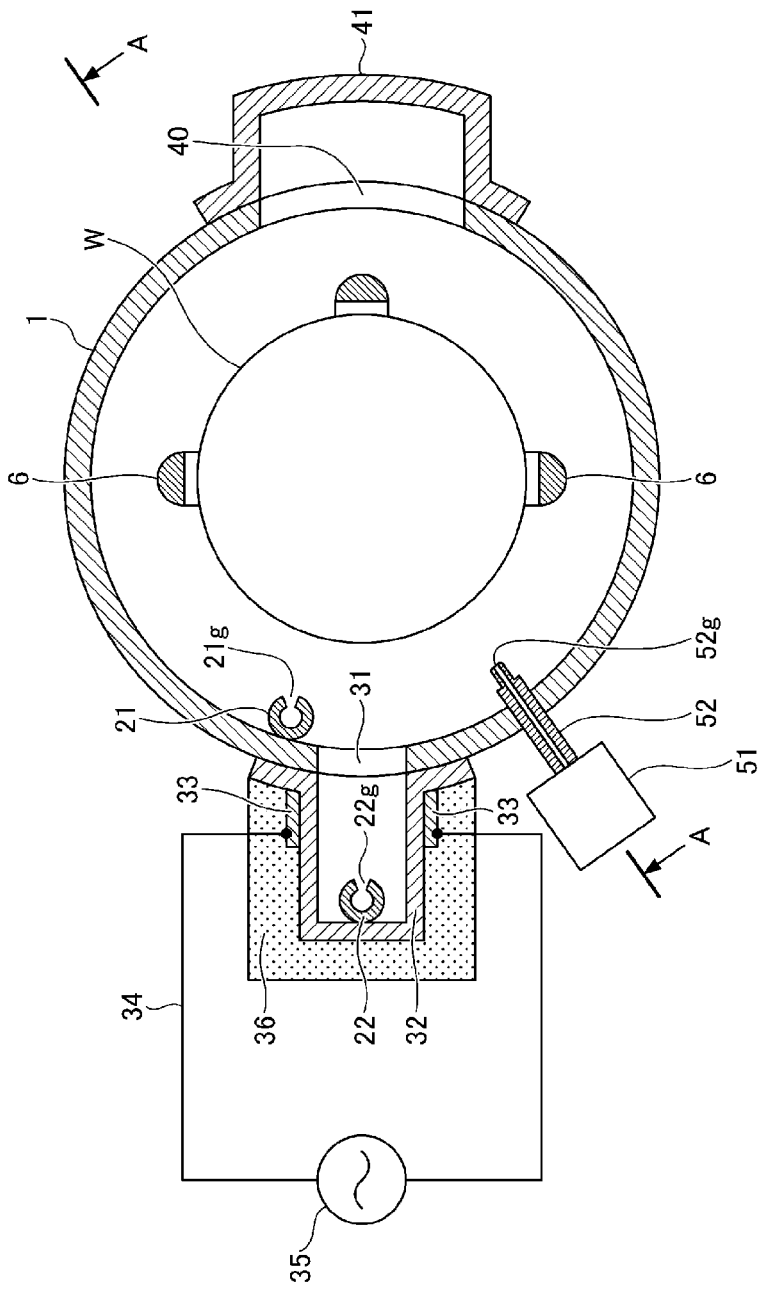
FIG. 2 is a schematic view illustrating an example of the configuration of the substrate processing apparatus, with a processing container cut horizontally.
Figure 3:
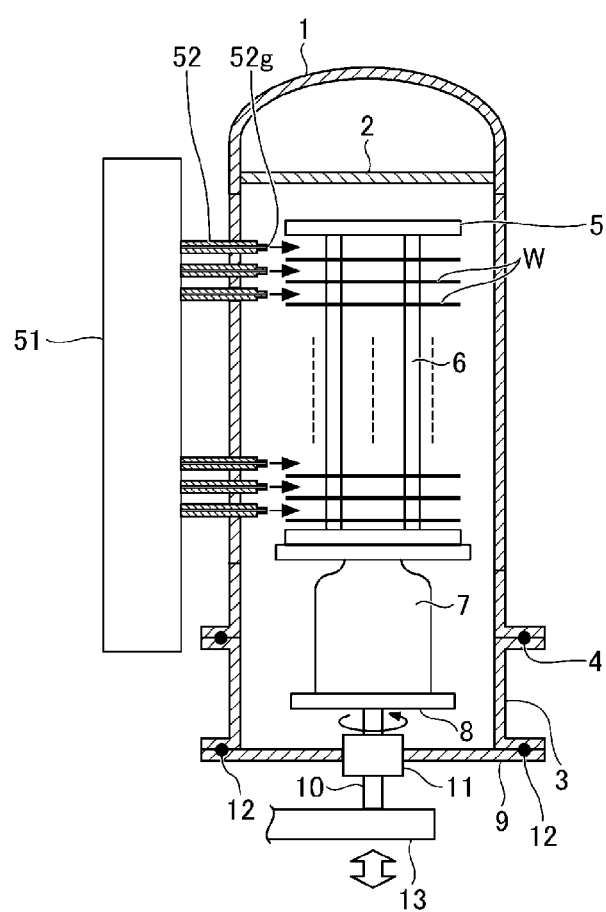
FIG. 3 is a schematic view illustrating an example of the configuration of the substrate processing apparatus, with the processing container cut vertically at A-A.

A substrate processing apparatus 100 according to an embodiment of the present disclosure will be described using FIGS. 1 to 3. FIG. 1 is a schematic view illustrating an example of a configuration of the substrate processing apparatus 100. FIG. 2 is a schematic view illustrating an example of the configuration of the substrate processing apparatus 100, with a processing container 1 cut horizontally. FIG. 3 is a schematic view illustrating an example of the configuration of the substrate processing apparatus 100, with the processing container 1 cut vertically at A-A. In FIGS. 2 and 3, the illustration of a heating mechanism 50 is omitted.

The substrate processing apparatus 100 includes a processing container 1 having a shape of a ceilinged cylindrical body with an opening at the lower end thereof. The entire processing container 1 is formed of, for example, quartz. A ceiling plate 2 made of quartz is provided inside the processing container 1 near the upper end thereof, and the area below the ceiling plate 2 is sealed. A cylindrical manifold 3 formed of a metal is connected to the opening of the lower end of the processing container 1 via a seal member 4 such as an O-ring.

The manifold 3 supports the lower end of the processing container 1, and a wafer boat (substrate holder) 5, in which a large number of (e.g., 25 to 150) semiconductor wafers (hereinafter, referred to as "substrates W") are arranged in multiple tiers, is inserted into the processing container 1 from below the manifold 3. In this way, the large number of substrates W are accommodated substantially horizontally inside the processing container 1 with intervals along the vertical direction. The wafer boat 5 is formed of, for example, quartz. The wafer boat 5 includes three rods 6 (of which two are illustrated in FIG. 1), and the large number of substrates W are supported by grooves (not illustrated) formed in the rods 6.

The wafer boat 5 is disposed on a table 8 via a heat insulating cylinder 7 formed of quartz. The table 8 is supported on a rotary shaft 10 that penetrates a lid 9 capable of opening/closing the opening of the lower end of the manifold 3 and formed of a metal (stainless steel).

A magnetic fluid seal 11 is provided at the penetrating portion of the rotary shaft 10 to airtightly seal and rotatably support the rotary shaft 10. A seal member 12 is provided between the peripheral portion of the lid 9 and the lower end of the manifold 3, to maintain the airtightness inside the processing container 1.

The rotary shaft 10 is attached to the tip of an arm 2 supported by a lift mechanism (not illustrated) such as, for example, a boat elevator, and the wafer boat 5 moves up and down together with the lid 9 to be inserted and removed into/from the processing container 1. The table 8 may be provided to be fixed to the lid 9, such that the substrates W may be processed without rotating the wafer boat 5.

The substrate processing apparatus 100 further includes a gas supply unit 20 (processing gas supply) that supplies a predetermined gas such as a processing gas or a purge gas into the processing container 1.

The gas supply unit 20 includes gas supply pipes 21, 22, 23, and 24. The gas supply pipe 21 is made of, for example, quartz, and penetrates the side wall of the manifold 3 inward to be bent upward and extend vertically. In the vertical portion of the gas supply pipe 21, a plurality of gas holes 21g is formed at predetermined intervals over the vertical length of the wafer boat 5 corresponding to the support range of the substrates. Each gas hole 21g discharges a gas in the horizontal direction. The gas supply pipe 22 is made of, for example, quartz, and penetrates the side wall of the manifold 3 inward to be bent upward and extend vertically. In the vertical portion of the gas supply pipe 22, a plurality of gas holes 22g is formed at predetermined intervals over the vertical length of the wafer boat 5 corresponding to the support range of the substrates. Each gas hole 22g discharges a gas in the horizontal direction. The gas supply pipe 23 is made of, for example, quartz, and includes a quartz pipe penetrating the side wall of the manifold 3 inward to be bent upward. The gas supply pipe 24 is made of, for example, quartz, and includes a short quartz pipe provided to penetrate the side wall of the manifold 3.

The vertical portion of the gas supply pipe 21 (the vertical portion where the gas holes 21g are formed) is installed inside the processing container 1. A processing gas is supplied to the gas supply pipe 21 from a gas supply source 21a through a gas pipe. The gas pipe is provided with a flow rate controller 21b and an opening/closing valve 21c. Thus, the processing gas from the gas supply source 21a is supplied into the processing container 1 through the gas pipe and the gas supply pipe 21. The processing gas supplied from the gas supply source 21a may be, for example, a raw material gas (precursor gas) such as HCD ($Si_2Cl_6$) gas or AlCl gas.

The vertical portion of the gas supply pipe 22 (the vertical portion where the gas holes 22g are formed) is installed in a plasma generation space to be described later. A processing gas is supplied to the gas supply pipe 22 from a gas supply source 22a through a gas pipe. The gas pipe is provided with a flow rate controller 22b and an opening/closing valve 22c. Thus, the processing gas from the gas supply source 22a is supplied into the plasma generation space through the gas pipe and the gas supply pipe 22, and turned into plasma in the plasma generation space to be supplied into the processing container 1. The processing gas supplied from the gas supply source 22a may be, for example, a reaction gas (nitriding gas or oxidizing gas) such as $NH_3$ gas or $O_3$.

An etchant gas is supplied to the gas supply pipe 23 from a gas supply source 23a through a gas pipe. The gas pipe is provided with a flow rate controller 23b and an opening/closing valve 23c. Thus, the etchant gas from the gas supply source 23a is supplied into the processing container 1 through the gas pipe and the gas supply pipe 23. The etchant gas may be, for example, hydrogen halide such as hydrogen fluoride (HF).

A purge gas is supplied to the gas supply pipe 24 from a purge gas supply source (not illustrated) through a gas pipe. The gas pipe (not illustrated) is provided with a flow rate controller (not illustrated) and an opening/closing valve (not illustrated). Thus, the purge gas from the purge gas supply source is supplied into the processing container 1 through the gas pipe and the gas supply pipe 24. The purge gas may be, for example, an inert gas such as argon (Ar) or nitrogen ($N_2$). It has been described that the purge gas is supplied into the processing container 1 from the purge gas supply source through the gas pipe and the gas supply pipe 24. However, without being limited thereto, the purge gas may be supplied from any of the gas supply pipes 21 and 23.

A plasma generation mechanism 30 is formed in a portion of the side wall of the processing container 1. The plasma generation mechanism 30 turns the processing gas from the gas supply source 22a into plasma.

The plasma generation mechanism 30 includes a plasma partition wall 32, a pair of plasma electrodes 33 (of which one is illustrated in FIG. 1), a power feed line 34, a radio-frequency power supply 35, and an insulation protection cover 36.

The plasma partition wall 32 is hermetically welded to the outer wall of the processing container 1. The plasma partition wall 32 is formed of, for example, quartz. The plasma partition wall 32 has a cross-sectional recessed shape and covers an opening 31 formed in the side wall of the processing container 1. The opening 31 is elongated vertically enough to encompass vertically all of the substrates W supported by the wafer boat 5. In the interior space defined by the plasma partition wall 32 while communicating with the inside of the processing container 1, i.e., the plasma generation space, the gas supply pipe 22 is disposed to eject the processing gas. The gas supply pipe 21 for ejecting the processing gas is provided at a position close to the substrates W along the inner wall of the processing container 1 outside the plasma generation space.

The pair of plasma electrodes 33 (of which one is illustrated in FIG. 1) each have an elongated shape, and are disposed on the outer surfaces of both side walls of the plasma partition wall 32, respectively, while facing each other along the vertical direction. Each plasma electrode 33 is held by a holding unit (not illustrated) provided, for example, on the side surface of the plasma partition wall 32. The power feed line 34 is connected to the lower end of each plasma electrode 33.

The power feed line 34 electrically connects each plasma electrode 33 to the ratio-frequency power supply 35. In the illustrated example, one end of the power feed line 34 is connected to the lower end of each plasma electrode 33, and the other end thereof is connected to the radio-frequency power supply 35.

The radio-frequency power supply 35 is connected to the lower end of each plasma electrode 33 via the power feed line 34, and supplies a radio-frequency power of, for example, 13.56 MHz to the pair of plasma electrodes 33. As a result, the radio-frequency power is applied to the inside of the plasma generation space defined by the plasma partition wall 32. The processing gas ejected from the gas supply pipe 21 is turned into plasma in the plasma generation space to which the radio-frequency power is applied, and supplied to the inside of the processing container 1 through the opening 31.

The insulation protection cover 36 is attached to the outer side of the plasma partition wall 32 to cover the plasma partition wall 32. A coolant passage (not illustrated) is formed in the inner portion of the insulation protection cover 36, allowing a coolant such as cooled nitrogen ($N_2$) gas to flow through the coolant passage, thereby cooling the plasma electrodes 33. A shield (not illustrated) may be provided between the plasma electrodes 33 and the insulation protection cover 36 to cover the plasma electrodes 33. The shield is formed of, for example, a good conductor such as a metal, and is grounded.

In the side wall portion of the processing container 1 opposite to the opening 31, an exhaust port (exhaust) 40 is formed to evacuate the inside of the processing container 1. The exhaust port 40 is elongated vertically, corresponding to the wafer boat 5. An exhaust port cover member 41, formed in a cross-sectional U shape, is attached to the portion of the processing container 1 corresponding to the exhaust port 40 to cover the exhaust port 40. The exhaust port cover member 41 extends upward along the side wall of the processing container 1. An exhaust pipe 42 is connected to the lower portion of the exhaust port cover member 41 to exhaust the processing container 1 through the exhaust port 40. An exhaust device 44 is connected to the exhaust pipe 42, and includes, for example, a pressure control valve 43 that controls the pressure in the processing container 1, and a vacuum pump. By the exhaust device 44, the inside of the processing container 1 is exhausted through the exhaust pipe 42.

A cylindrical heating mechanism 50 is provided around the processing container 1. The heating mechanism 50 heats the processing container 1 and the substrates W inside the processing container 1. The heating mechanism 50 controls the temperature of the processing container 1 to reach a desired temperature (e.g., 600° C.). As a result, the substrates W inside the processing container 1 are heated by, for example, a radiant heat from the wall surface of the processing container 1.

The substrate processing apparatus 100 further includes a cooling gas injection unit that injects a cooling gas toward the substrates W to cool the substrates W. The cooling gas injection unit includes a gas cooling device 51 and a cooling gas supply pipe 52 with a gas nozzle 52g.

The gas cooling device 51 supplies a cooling gas to the cooling gas supply pipe 52. As for the cooling gas, for example, an inert gas such as nitrogen ($N_2$) may be used. The gas cooling device 51 is equipped with a cooler that cools, for example, an inert gas supplied from a gas supply source for supplying the inert gas, a flow rate controller, and an opening/closing valve. The cooler generates the cooling gas by cooling the inert gas to a desired temperature. The flow rate controller controls the flow rate of the cooling gas supplied to the cooling gas supply pipe 52. The opening/closing valve controls the supply of the cooling gas to the cooling gas supply pipe 52, or the stop of the supply. The gas cooling device 51 is provided outside the the cylindrical heating mechanism 50. The temperature of the cooling gas (e.g., −100° C. to 30° C.) is lower than the temperature of the processing container 1 (e.g., 600° C.) controlled by the heating mechanism 50.

The cooling gas supply pipe 52 penetrates the heating mechanism 50 provided around the processing container 1, and also penetrates the side wall of the processing container 1, to inject the cooling gas toward the substrates W arranged on the wafer boat from side through the gas nozzle 52g. By injecting the cooling gas from the cooling gas supply pipe 52 toward the substrates W, the temperature of the substrates W inside the processing container 1 is lowered. When the injection of the cooling gas from the cooling gas supply pipe 52 is stopped, the temperature of the substrates W inside the processing container 1 is raised by, for example, the radiant heat from the wall surface of the processing container 1.

By providing the cooling gas supply pipe 52 to penetrate the side wall of the processing container 1, the pipe length from the side wall of the processing container 1 to the gas nozzle 52g may be shortened, and the cooling gas flowing through the cooling gas supply pipe 52 may be suppressed from being heated by the heat of the processing container 1. That is, since the temperature of the cooling gas injected to the substrates W may be kept low, the temperature of the substrates W may be dropped at a high speed. Further, the cooling gas that has been used to drop the temperature of the substrates W is exhausted from the exhaust port 40. As a result, the temperature drop of the side wall of the processing container 1 may be suppressed.

A plurality of cooling gas supply pipes 52 is provided. The gas nozzle 52g is provided for each of the substrates W arranged in multiple tiers on the wafer boat 5. In the example illustrated in FIG. 3, each cooling gas supply pipe 52 has one gas nozzle 52g, one cooling gas supply pipe 52 is provided for one substrate W, and one gas nozzle 52g is provided for each substrate W. As a result, the cooling gas may be injected to the substrates W disposed in multiple tiers on the wafer boat 5, at the same gas volume and velocity. Therefore, the temperature of each of the substrates W disposed in multiple tiers may be lowered.

The substrate processing apparatus 100 further includes a control unit 60. The control unit 60 controls the operation of each component of the substrate processing apparatus 100, for example, the supply of each gas and the stop of the supply by the opening/closing of the opening/closing valves 21c to 23c, the control of the gas flow rate by the flow rate controllers 21b to 23b, and the exhaust control by the exhaust device 44. Further, the control unit 60 controls, for example, the ON/OFF of the radio-frequency power by the radio-frequency power supply 35, and the temperatures of the processing container 1 and the substrates W inside the processing container 1 by the heating mechanism 50. Further, the control unit 60 controls the temperature of the substrates W by, for example, the gas cooling device 51.

The control unit 60 may be, for example, a computer. A program of the computer that executes the operation of each component of the substrate processing apparatus 100 is stored in a storage medium. The storage medium may be, for example, a flexible disk, a compact disk, a hard disk, a flash memory, or a DVD.

Figure 4:
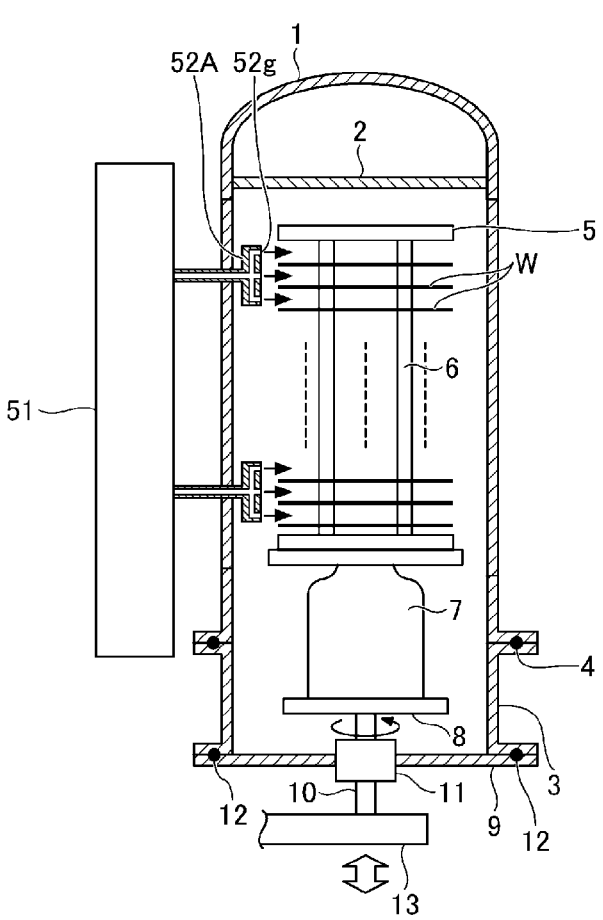
FIG. 4 is a schematic view illustrating another example of the configuration of the substrate processing apparatus, with the processing container cut vertically at A-A.

The configuration of the substrate processing apparatus 100 is not limited to that described above. FIG. 4 is a schematic view illustrating another example of the configuration of the substrate processing apparatus 100, with the processing container 1 cut vertically at A-A. FIG. 4 omits the illustration of the heating mechanism 50.

In the example illustrated in FIG. 4, the configuration of a cooling gas supply pipe 52A is different. Since the other configurations are the same, overlapping descriptions thereof will be omitted. The cooling gas supply pipe 52A branches inside the processing container 1, and has a plurality of gas nozzles 52g (three in the example of FIG. 4). Each gas nozzle 52g is provided for one substrate W. As a result, the number of cooling gas supply pipes 52A penetrating the heating mechanism 50 and the side wall of the processing container 1 may be reduced.

Although not illustrated, each gas nozzle 52g may be provided for two substrates W. One substrate W is disposed above another substrate W, and one gas nozzle 52g injects the cooling gas between the two substrates W. In other words, one gas nozzle 52g injects the cooling gas to the rear surface of one substrate W and the front surface of anther substrate W. As a result, the cooling gas injected from one gas nozzle 52g lowers the temperature of two substrates W. The cooling gas supply pipe may be the cooling gas supply pipe 52 with one gas nozzle 52g (see, e.g., FIG. 3) or the cooling gas supply pipe 52A with a plurality of (e.g. three) gas nozzles 52g (see, e.g., FIG. 4).

[Substrate Processing by Substrate Processing Apparatus]

Figure 5:
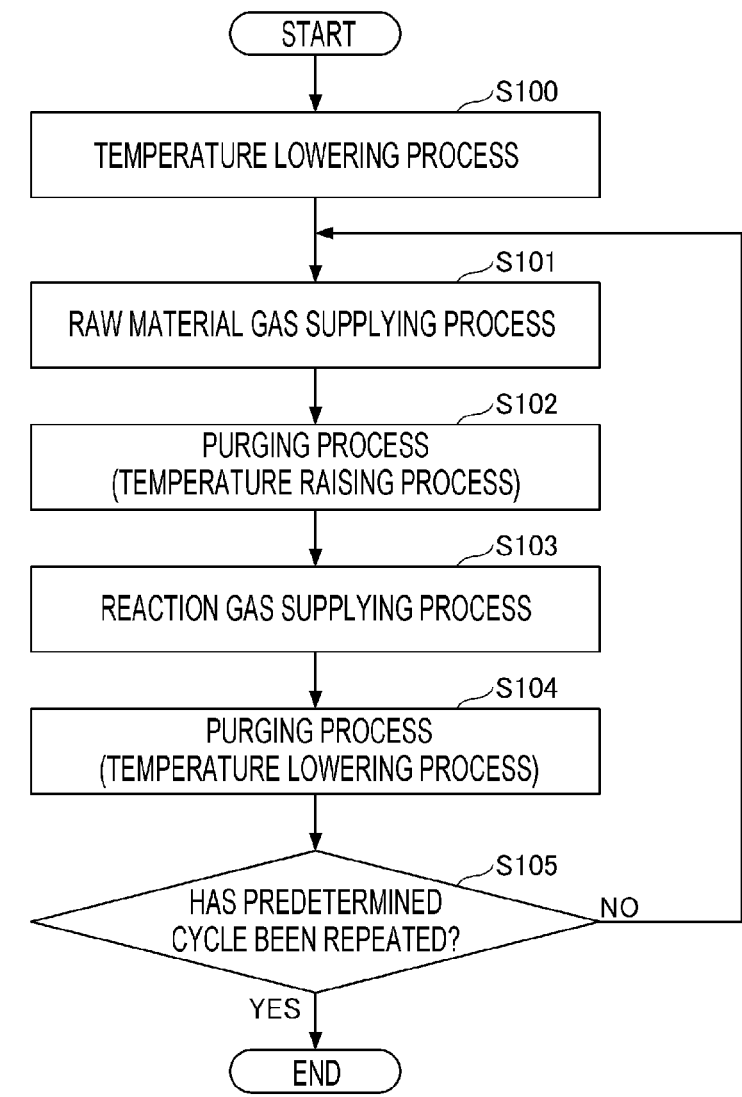
FIG. 5 is a flow chart illustrating an example of a substrate processing.
Figure 6:
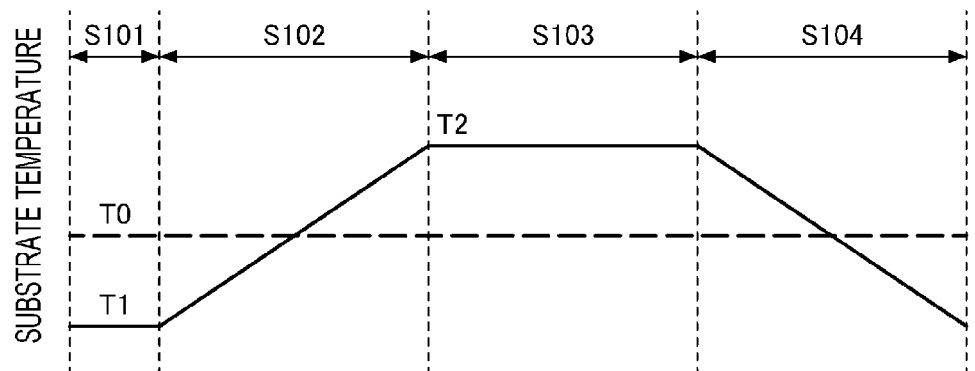
FIG. 6 is a graph illustrating a temperature control in an example of the substrate processing.

Next, an example of a substrate processing by the substrate processing apparatus 100 will be described using FIGS. 5 and 6. FIG. 5 is a flow chart illustrating an example of the substrate processing. FIG. 6 is a graph illustrating a temperature control in the example of the substrate processing. Here, descriptions will be made on a case where a SiN film is formed on the substrates W in an atomic layer deposition (ALD) cycle, using $Si_2Cl_6$ gas as a raw material gas and $NH_3$ gas as a reaction gas.

In step S100, the control unit 60 performs a temperature lowering process. The temperature lowering process is a process of injecting the cooling gas from the gas nozzle 52g to lower the temperature of the substrates W. In the temperature lowering process, the opening/closing valve of the gas cooling device 51 is opened to supply the cooling gas from the gas cooling device 51 to the cooling gas supply pipe 52, and inject the cooling gas from the gas nozzle 52g to the substrates W, thereby lowering the temperature of the substrates W. As a result, when the temperature of the substrates W stabilizes at a temperature T1, the opening/closing valve of the gas cooling device 51 is closed, and the process proceeds to step S101.

In step S101, the control unit 60 performs a raw material gas suppling process as a first processing process. The raw material gas supplying process is a process of supplying $Si_2Cl_6$ gas, which is a raw material gas, as a first processing gas into the processing container 1. In the raw material gas supplying process, the opening/closing valve 21c is opened to supply the raw material gas ($Si_2Cl_6$) from the gas supply source 21a into the processing container 1 through the gas supply pipe 21. As a result, a precursor containing Si is adsorbed onto the surfaces of the substrates W.

In step S102, the control unit 60 performs a purging process. The purging process is a process of purging, for example, an excess raw material gas inside the processing container 1. In the purging process, the opening/closing valve 21c is closed to stop the supply of the raw material gas. As a result, the purge gas constantly supplied from the gas supply pipe 24 purges, for example, the excess raw material gas inside the processing container 1.

Further, in step S102, the substrates W in the processing container 1 are heated by, for example, the radiant heat from the wall surface of the processing container 1, and the temperature of the substrates W rises from the temperature T1 to a temperature T2. Therefore, the purging process of step S102 includes a temperature raising process to raise the temperature of the substrates W.

In step S103, the control unit 60 performs a reaction gas supplying process as a second processing process. The reaction gas supplying process is a process of supplying active species of $NH_3$ gas, which is a reaction gas, as a second processing gas into the processing container 1. In the reaction gas supplying process, the opening/closing valve 22c is opened to supply the reaction gas ($NH_3$) from the gas supply source 22a into the plasma partition wall 32 through the gas supply pipe 22. Further, the radio-frequency power is applied to the plasma electrodes 33 by the radio-frequency power supply 35 to generate plasma inside the plasma partition wall 32. Then, active species of the reaction gas ($NH_3$) are generated and supplied into the processing container 1 through the opening 31. As a result, the Si-containing precursor that has been adsorbed onto the surfaces of the substrate W is nitridated, and SiN is formed on the surfaces of the substrates W.

In step S104, the control unit 60 performs a purging process. The purging process is a process of purging, for example, an excess reaction gas inside the processing container 1. In the purging process, the opening/closing valve 22c is closed to stop the supply of the reaction gas. As a result, the purge gas constantly supplied from the gas supply pipe 24 purges, for example, the excess reaction gas in the processing container 1.

Further, in step S104, the control unit 60 performs the purging process and also performs a temperature lowering process. The temperature lowering process is a process of injecting the cooling gas from the gas nozzle 52g to lower the temperature of the substrates W. In the temperature lowering process, the opening/closing valve of the gas cooling device 51 is opened to supply the cooling gas from the gas cooling device 51 to the cooling gas supply pipe 52, and inject the cooling gas from the gas nozzle 52g to the substrates W, thereby lowering the temperature of the substrates W. As a result, the temperature of the substrates W drops from the temperature T2 to the temperature T1. When the temperature of the substrates W stabilizes at the temperature T1, the opening/closing valve of the gas cooling device 51 is closed, and the process proceeds to step S105.

In step S105, the control unit 60 determines whether a predetermined cycle has been repeated, defining steps S101 to S104 as one ALD cycle. When it is determined that the predetermined cycle has not been repeated (S105, NO), the control unit 60 returns to step S101 and repeats the ALD cycle. When it is determined that the predetermined cycle has been repeated (S105, YES), the control unit 60 terminates the substrate processing (film forming process).

FIG. 6 illustrates the temperature control by the substrate processing apparatus 100 by a solid line. In the temperature control by the substrate processing apparatus 100, the temperature of the substrates W is controlled to the temperature T1 during the raw material gas supplying process, and controlled to the temperature T2 (T2>T1) during the reaction gas supplying process.

Here, FIG. 6 illustrates another temperature control by a dashed line. In another temperature control, the control unit 60 controls the heating mechanism 50 to control the temperature of the side wall of the processing container 1 to a predetermined temperature, so that the temperature of the substrates W becomes constant at a temperature T0 during the ALD cycle as illustrated by the dashed line in FIG. 6.

However, in the raw material gas supplying process of step S101, the temperature T0 of the substrates W is higher than the temperature of the region where the raw material gas undergoes the ALD reaction, and therefore, may enter the region where the chemical vapor deposition (CVD) reaction occurs. Thus, in another temperature control, the controllability of the film thickness of the SiN film may deteriorate.

Meanwhile, in the reaction gas supplying process of step S103, the temperature T0 of the substrates W is lower than the ideal temperature at which the active species of the reaction gas reacts the precursor adsorbed onto the surfaces of the substrates W, resulting in decreasing the reaction rate (nitridation rate). Therefore, in another temperature control, the film formation rate of the SiN film may deteriorate.

In contrast, in the temperature control by the substrate processing apparatus 100, the temperature of the substrates W is controlled to the temperature T1 (T1<T0) during the raw material gas supplying process. As a result, the precursor may be adsorbed onto the surfaces of the substrates W in the temperature region where the ALD reaction occurs. Further, in the temperature control by the substrate processing apparatus 100, the temperature of the substrates W is controlled to the temperature T2 (T2>T0) during the reaction gas supplying process. As a result, the reaction rate (nitridation rate) may be accelerated. Further, in the substrate processing apparatus 100, the temperature of the substrates W may be lowered and raised at a high speed.

The temperature T1 of the substrates W in the raw material gas supplying process may be controlled to be constant, regardless of the number of ALD cycles. Further, the temperature T1 of the substrates W in the raw material gas supplying process may be changed according to an increase in the number of ALD cycles.

Here, descriptions will be made on an example of the film forming process that embeds the SiN film in a recess such as a trench formed in each substrate W. When the decomposition of the precursor progresses as the temperature rises, the precursor is adsorbed onto the upper (entrance) side of the recess, and thus, reaches the lower (bottom) side of the recess in a reduced amount. Thus, the coverage when embedding the SiN film in the recess deteriorates. Accordingly, a control may be performed to raise the temperature T1 of the substrates W during the raw material gas supplying process as the number of ALD cycles increases. That is, in a state where the number of ALD cycles is small, the temperature T1 of the substrates W during the raw material gas supplying process is lowered because the aspect ratio of the recess is high. As a result, the precursor may reach the lower (bottom) side of the recess. Then, in a state where the number of ALD cycles is large, the temperature T1 of the substrates W during the raw material gas supplying process is raised because the aspect ratio of the recess is low. As a result, the coverage when embedding the SiN film in the recess may be improved.

The temperature T2 of the substrates W during the reaction gas supplying process may be controlled to be constant, regardless of the number of ALD cycles. Further, the temperature T2 of the substrates W during the reaction gas supplying process may be changed according to an increase in the number of ALD cycles.

In the descriptions above, the first processing process to supply the first processing gas is the raw material gas supplying process to supply the raw material gas (precursor gas) into the processing container 1, and the second processing process to supply the second processing gas is the reaction gas supplying process to supply the reaction gas into the processing container 1. However, the present disclosure is not limited thereto. For example, the present disclosure may be applied to a process of forming a silicon nitride film using an Si-containing gas as the raw material gas and an N-containing gas as the reaction gas. Further, the present disclosure may be applied to a process of forming a silicon oxide film using an Si-containing gas as the raw material gas and an O-containing gas as the reaction gas. Further, the present disclosure may be applied to a process of forming an aluminum nitride film using an Al-containing gas as the raw material gas and an N-containing gas as the reaction gas. Further, the present disclosure may be applied to a process of forming an aluminum oxide film using an Al-containing gas as the raw material gas and an O-containing gas as the reaction gas. The combination of the raw material gas and the reaction gas is not limited to those above.

In the descriptions above, the substrate processing is performed by the plasma ALD process that generates plasma during the reaction gas supplying process. However, the present disclosure is not limited thereto. The substrate processing may be performed by a thermal ALD process that does not use plasma in the reaction gas supplying process.

In the descriptions above, the film forming process is performed by the ALD process. However, the present disclosure is not limited thereto, and may be applied to an etching by an atomic layer etching (ALE) process.

Figures 7A, 7B, 7C, 7D:
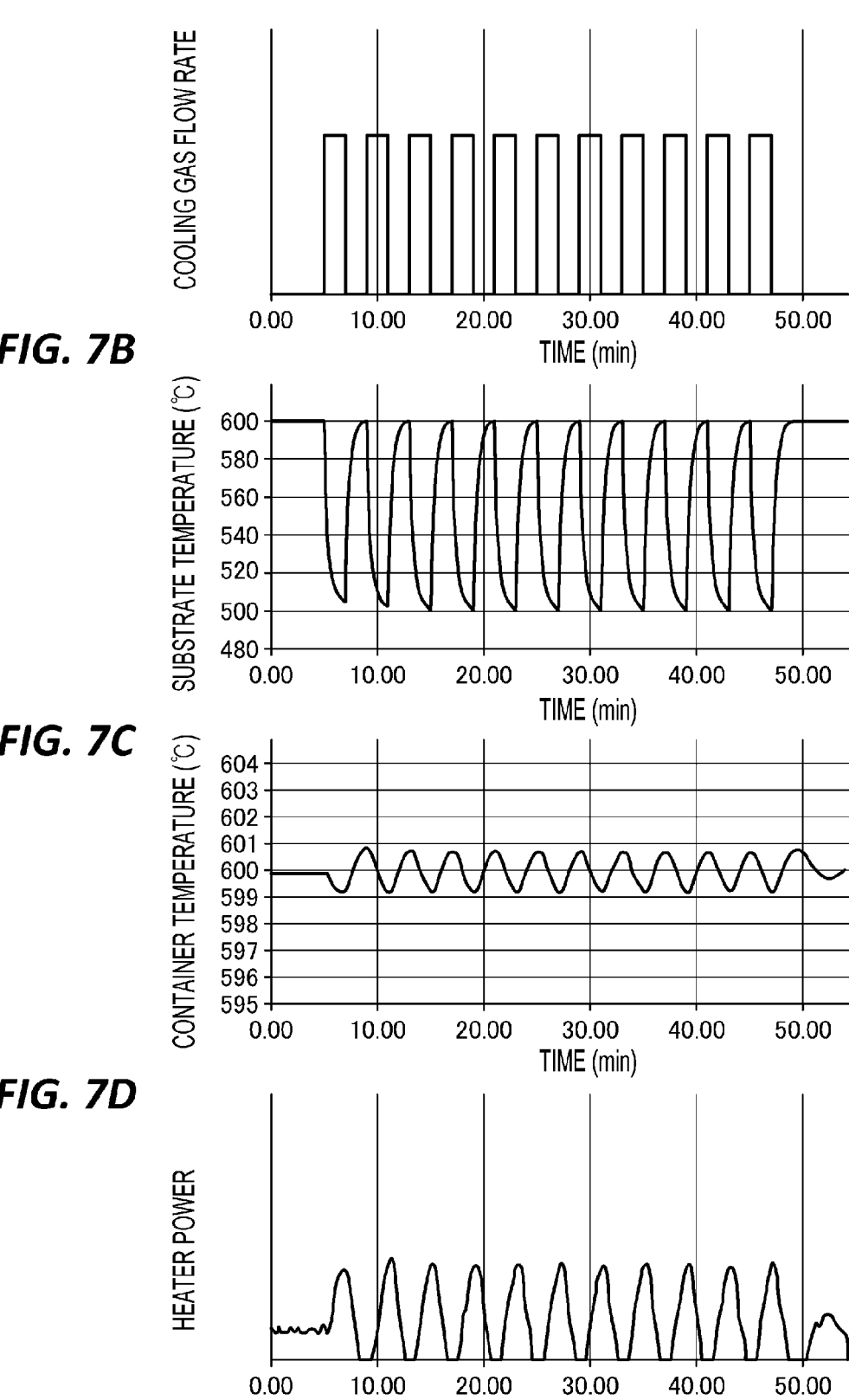
FIGS. 7A to 7D are examples of experiment results obtained by repeating an injection of a cooling gas and a stop of the injection.

FIGS. 7A to 7D are examples of experiment results obtained by repeating the injection of the cooling gas and the stop of the injection. FIG. 7A illustrates the flow rate of the cooling gas injected from the gas nozzle 52g. FIG. 7B illustrates the temperature of the substrates W. FIG. 7C illustrates the temperature of the side wall of the processing container 1. FIG. 7D illustrates the heater power of the heating mechanism 50. Here, the heating mechanism 50 controls the heater power such that the temperature of the side wall of the processing container 1 reaches a predetermined set temperature (here, 600° C.).

Although not illustrated, when the heating mechanism 50 is controlled to lower the temperature of the processing container 1 by 100° C. thereby lowering the temperature of the substrates W in the processing container 1 by 100° C., a long time is needed due to the large thermal capacity of, for example, the processing container 1. Further, when the temperature of the processing container 1 is raised to the original temperature, a long time is identically needed due to the large thermal capacity of, for example, the processing container 1.

Meanwhile, in FIG. 7A, the injection of the cooling gas and the supply of the injection are repeated at two-minute intervals. In this case, as illustrated in FIG. 7B, the temperature of the substrates W is lowered by about 100° C. during the injection of the cooling gas for two minutes. When the injection of the cooling gas is stopped, the temperature rises to the original temperature. Thus, the substrate processing apparatus 100 may raise and lower the temperature of the substrates W at a high speed.

As illustrated in FIG. 7C, the temperature of the processing container 1 is lowered by the injection of the cooling gas. As illustrated in FIG. 7D, the heating mechanism 50 controls the heater power. Thus, the temperature change of the side wall of the processing container 1 falls in the range of −1° C. to +1° C. As a result, without changing the set temperature of the heating mechanism 50, the shapes applied to the process of the substrate processing by the temperature change of the side wall of the processing container 1 may be suppressed.

Figure 8:
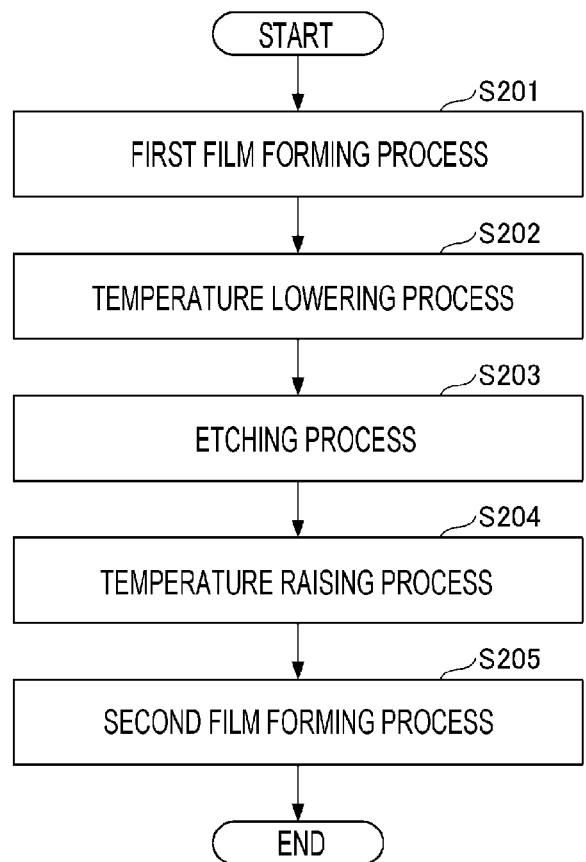
FIG. 8 is a flow chart illustrating another example of the substrate processing.

Next, another example of the substrate processing by the substrate processing apparatus 100 will be described using FIGS. 8 to 10. FIG. 8 is a flow chart illustrating another example of the substrate processing.

In step S201, the control unit 60 performs a first film forming process as a first processing process. The first film forming process is a process of performing a film formation on each substrate W with a recess such as a trench formed therein. In the first film forming process, as the first processing gas, for example, the raw material gas is supplied from the gas supply pipe 21, and the reaction gas is supplied from the gas supply pipe 22, to perform the film formation process on the substrates W. The film forming process may be a film forming process using the ALD reaction, a film forming process using the CVD reaction, or any other film forming processes. Here, the heating mechanism 50 controls the heater power such that the temperature of the side wall of the processing container 1 reaches the predetermined set temperature T3. In the first film forming process, the temperature of the substrates W is the temperature T3. In step S202, the control unit 60 performs the temperature lowering process. The temperature lowering process is a process of injecting the cooling gas from the gas nozzle 52g to lower the temperature of the substrates W. In the temperature lowering process, the opening/closing valve of the gas cooling device 51 is opened to supply the cooling gas from the gas cooling device 51 to the cooling gas supply pipe 52, and inject the cooling gas from gas nozzle 52g to the substrates W, thereby lowering the temperature of the sub-strates W. As a result, the temperature of the substrates W is cooled to the temperature T4 (T4<T3). When the tempera-ture of the substrates W stabilizes at the temperature T4, the opening/closing valve of the gas cooling device 51 is closed, and the process proceeds to step S203.

In step S203, the control unit 60 performs an etching process as a second processing process. The etching process is a process of etching the film formed on the upper side of a recess such as a trench. In the etching process, for example, an etchant gas is supplied as the second processing gas from the gas supply pipe 23, to perform the etching process on the substrates W. As a result, a film may be embedded from the bottom side of the recess of the substrate W. Here, in the etching process, the temperature of the substrates W is the temperature T4.

In step S204, the control unit 60 performs the temperature raising process. In the temperature raising process, the substrates W in the processing container 1 are heated by, for example, the radiant heat from the wall surface of the processing container 1, and the temperature of the substrates W is raised from the temperature T4 to the temperature T3. When the temperature of the substrates W stabilizes at the temperature T3, the process proceeds to step S204.

In step S205, the control unit 60 performs a second film forming process as a third processing process. The second film forming process is a process of performing a film forming process on each substrate W with a recess such as a trench formed therein. In the second film forming process, as a third processing gas, for example, the raw material gas is supplied from the gas supply pipe 21, and the reaction gas is supplied from the gas supply pipe 22, to perform the film forming process on the substrates W. The film forming process may be the film forming process using the ALD reaction, the film forming process using the CVD reaction, or any other film forming processes. Here, the heating mechanism 50 controls the heater power such that the temperature of the side wall of the processing container 1 reaches the predetermined set temperature T3. In the first film forming process, the temperature of the substrates W is the temperature T3.

As a result, a film may be formed in the recess in a bottom-up manner.

Figure 9:
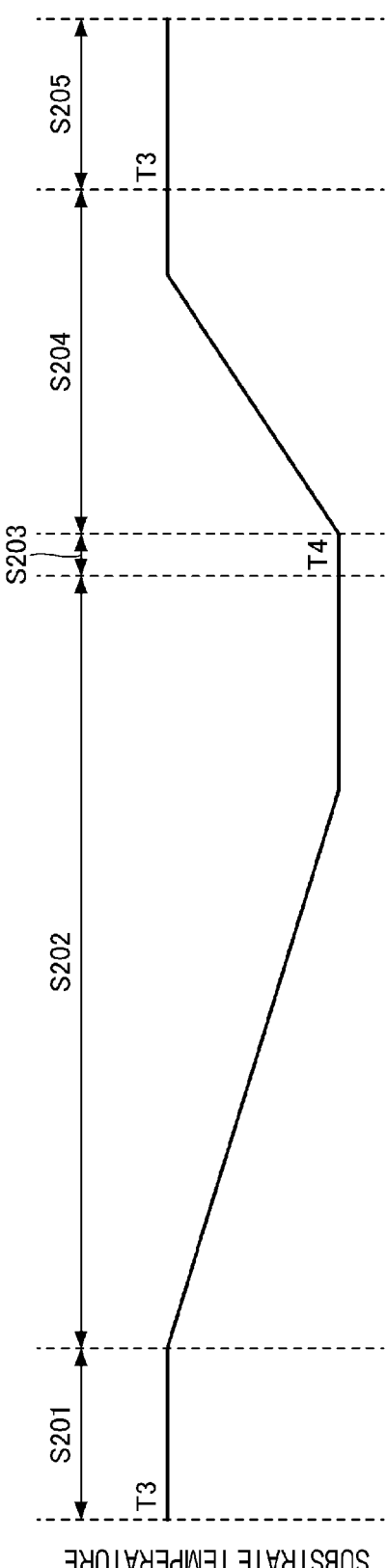
FIG. 9 is a graph illustrating a temperature control of a substrate using a temperature control by a heating mechanism.

FIG. 9 is a graph illustrating the temperature control of the substrates W using the temperature control by the heating mechanism 50. In FIG. 9, the vertical axis represents a temperature, and the horizontal axis represents time.

As illustrated in FIG. 9, in the temperature control of the substrates W using the temperature control by the heating mechanism 50, it takes a long time to perform the tempera-ture lowering process of step S202 and the temperature raising process of step S204, as compared to the time required to perform the etching process of step S203, because of the large thermal capacity of, for example, the processing container 1. Accordingly, the time required for the entire process from steps S201 to S205 also increases.

Figure 10:
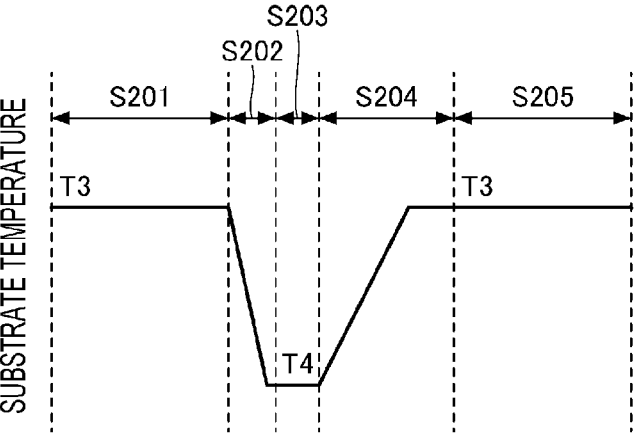
FIG. 10 is a graph illustrating a temperature control of a substrate using a temperature control by the injection of the cooling gas.

FIG. 10 is a graph illustrating the temperature control of the substrates W using the temperature control by the injection of the cooling gas. In FIG. 10, the vertical axis represents a temperature, and the horizontal axis represents time.

As illustrated in FIG. 10, in the temperature control of the substrates W using the temperature control by the injection of the cooling gas, the temperature lowering process of step S202 and the temperature raising process of step S204 may be significantly shortened, and the time required for the entire process from steps S201 to S205 may also be short-ened. As a result, the throughput of the substrate processing apparatus 100 may be improved.

According to an aspect of the present disclosure, it is possible to provide a substrate processing apparatus and a substrate processing method, which improve the throughput.

From the foregoing, it will be appreciated that various embodiments of the present disclosure have been described herein for purposes of illustration, and that various modifi-cations may be made without departing from the scope and spirit of the present disclosure. Accordingly, the various embodiments disclosed herein are not intended to be limit-ing, with the true scope and spirit being indicated by the following claims.

What is claimed is:

1. A substrate processing apparatus comprising:
   a processing container configured to accommodate a substrate;
   a processing gas supply configured to supply a processing gas into the processing container;
   an exhaust configured to exhaust an inside of the pro-cessing container;
   a heater provided around the processing container and configured to heat the processing container; and
   a cooling gas injector including a cooling gas supply pipe that penetrates the heater and a side wall of the pro-cessing container, the cooling gas supply pipe having a gas nozzle configured to inject a cooling gas for cooling the substrate toward the substrate from a lateral side within the processing container.

2. The substrate processing apparatus according to claim 1, wherein the cooling gas injector includes:
   a gas cooler configured to supply the cooling gas to the cooling gas supply pipe.

3. The substrate processing apparatus according to claim 2, further comprising:
   a substrate holder configured to dispose a plurality of substrates thereon in multiple tiers,
   wherein a plurality of cooling gas supply pipes is pro-vided.

4. The substrate processing apparatus according to claim 3, wherein each of the plurality of cooling gas supply pipes has one gas nozzle.

5. The substrate processing apparatus according to claim 3, wherein each of the plurality of cooling gas supply pipes branches inside the processing container, and includes a plurality of gas nozzles.

6. The substrate processing apparatus according to claim 3, wherein the gas nozzle is provided for each substrate in a one-to-one correspondence.

7. The substrate processing apparatus according to claim 3, wherein the gas nozzle is provided for two substrates.

8. The substrate processing apparatus according to claim 1, further comprising:
   a controller,
   wherein the controller is configured to:
      control the heater to make a temperature of the pro-cessing container reach a temperature set in advance, and control the cooling gas injector to perform a temperature lowering process to lower the temperature of the substrate by injecting the cooling gas while controlling the heater such that the temperature of the processing container reaches the temperature set in advance, and a temperature raising process to raise the temperature of the substrate with a radiant heat from the processing container by stopping an injection of the cooling gas.

9. The substrate processing apparatus according to claim 8, wherein the controller is configured to control the processing gas supply to perform a first processing process to supply a first processing gas into the processing container after the temperature lowering process, and a second processing process to supply a second processing gas into the processing container after the temperature raising process.

10. The substrate processing apparatus according to claim 9, wherein the controller is configured to control the processing gas supply to repeat the first processing process and the second processing process.

11. The substrate processing apparatus according to claim 10, wherein in the first processing process, a raw material gas is supplied as the first processing gas, and in the second processing process, a reaction gas is supplied as the second processing gas.

12. The substrate processing apparatus according to claim 8, wherein the controller is configured to control the processing gas supply to perform a first processing process to supply a first processing gas into the processing container, a second processing process to supply a second processing gas into the processing container after the temperature lowering process, and a third processing process to supply a third processing gas into the processing container after the temperature raising process.

13. The substrate processing apparatus according to claim 12, wherein the first processing process is a first film forming process, the second processing process is an etching process, and the third processing process is a second film forming process.

14. A substrate processing method comprising:

providing a substrate processing apparatus including a processing container configured to accommodate a substrate, a processing gas supply configured to supply a processing gas into the processing container, an exhaust configured to exhaust an inside of the processing container, a heater provided around the processing container and configured to heat the processing container, and a cooling gas injector including a cooling gas supply pipe that penetrates the heater and a side wall of the processing container, the cooling gas supply pipe having a gas nozzle configured to inject a cooling gas toward the substrate from a lateral side within the processing container in order to cool the substrate;

controlling the heater to make a temperature of the processing container reach a temperature set in advance;

injecting the cooling gas to lower the temperature of the substrate; and stopping an injection of the cooling gas to raise the temperature of the substrate with a radiant heat from the processing container.

15. The substrate processing apparatus according to claim 1, further comprising:

a controller, wherein the controller is configured to control the cooling gas injector to inject the cooling gas toward the substrate in the processing container while the heater heats the processing container.

16. The substrate processing method according to claim 14, wherein the cooling gas is an inert gas.

17. The substrate processing method according to claim 14, wherein the cooling gas is nitrogen gas.

18. The substrate processing method according to claim 14, further comprising:

after injecting the cooling gas, exhausting the cooling gas.

* * * * *